(12) United States Patent
Murchison et al.

(10) Patent No.: US 6,295,208 B1
(45) Date of Patent: Sep. 25, 2001

(54) BACKPLATE FOR SECURING A CIRCUIT CARD TO A COMPUTER CHASSIS

(75) Inventors: Loren Murchison, Santa Clara; Carlos Burbano, Milpitas; Brian Geroge Reeve, San Jose, all of CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/248,780

(22) Filed: Feb. 12, 1999

(51) Int. Cl.[7] .............. H05K 5/00; H05K 5/09; H05K 5/06
(52) U.S. Cl. .......... 361/759; 174/255; 174/52.1
(58) Field of Search ............... 174/52.1, 59, 61, 174/255, 262; 361/752, 753, 756, 759

(56) References Cited

U.S. PATENT DOCUMENTS

| | | | |
|---|---|---|---|
| 4,581,678 | 4/1986 | Chambers | 361/331 |
| 4,584,511 | 4/1986 | Rudich, Jr. et al. | 318/600 |
| 4,620,279 | 10/1986 | Read et al. | 364/200 |
| 4,791,524 | 12/1988 | Teigen et al. | 361/212 |
| 4,873,395 | 10/1989 | Mast | 174/35 |
| 4,915,098 | 4/1990 | Young et al. | 128/88 |
| 4,949,760 | 8/1990 | Wilson et al. | 139/66 R |
| 4,971,524 | 11/1990 | Teigen et al. | 361/212 |
| 4,971,563 | 11/1990 | Wells, III | 439/61 |
| 4,987,517 | 1/1991 | Kurz | 361/417 |
| 5,004,867 | 4/1991 | Mast | 174/35 |
| 5,039,247 | 8/1991 | Young et al. | 403/92 |
| 5,168,424 | 12/1992 | Bolton et al. | 361/384 |
| 5,317,483 | 5/1994 | Swindler | 361/801 |
| 5,398,156 | 3/1995 | Steffes et al. | 361/683 |
| 5,446,452 | 8/1995 | Litton | 340/870.17 |
| 5,575,546 | 11/1996 | Radloff | 312/183 |
| 5,650,922 | 7/1997 | Ho | 361/799 |
| 5,700,496 | 12/1997 | Bacon | 425/193 |
| 5,703,436 | 12/1997 | Forrest et al. | 313/506 |
| 5,829,601 | * 11/1998 | Yurchenco et al. | 211/41.17 |
| 5,848,906 | 12/1998 | Glusker et al. | 439/157 |
| 5,856,910 | * 1/1999 | Yurchenco et al. | 361/704 |
| 5,880,930 | 3/1999 | Wheaton | 361/690 |
| 5,896,534 | 4/1999 | Pearce et al. | 395/680 |
| 5,903,441 | * 5/1999 | Dean et al. | 361/756 |
| 5,961,352 | 10/1999 | Denny et al. | 439/637 |
| 5,986,892 | 11/1999 | Hargy, III | 361/759 |
| 5,988,348 | 11/1999 | Martin et al. | 194/317 |
| 5,999,411 | * 12/1999 | Patel | 361/759 |
| 6,040,982 | 3/2000 | Gandre et al. | 361/724 |
| 6,069,796 | 5/2000 | Hastings et al. | 361/754 |
| 6,097,374 | 8/2000 | Howard | 345/168 |
| 6,147,874 | * 11/2000 | Burbano et al. | 361/759 |
| 6,169,488 | 1/2001 | Ketler | 340/632 |
| 6,171,120 | 1/2001 | Bolich et al. | 439/157 |

* cited by examiner

Primary Examiner—Jeffrey Gaffin
Assistant Examiner—Jeremy Norris
(74) Attorney, Agent, or Firm—McDonnell Boehnen Hulbert & Berghoff

(57) ABSTRACT

A backplate is provided having an elongated section with one or more tab sets. Each tab sets includes a first and second tab that extends from the elongated section. The first and second tabs are laterally spaced apart and longitudinally offset with respect to each other to define a slot for retaining a substrate such as a circuit card. The first tab may include a tang that contacts a fastener hole of the substrate, and may include a distal contact surface for contacting a grounding plane on the substrate. The second tab may be curved, or may include a tang that contacts another fastener hole of the substrate.

38 Claims, 12 Drawing Sheets

US 6,295,208 B1

BACKPLATE FOR SECURING A CIRCUIT CARD TO A COMPUTER CHASSIS

BACKGROUND OF THE INVENTION

The present invention pertains to backplates that secures a substrate to a computer chassis. More specifically, the present invention pertains to a backplate that secures to a substrate of a circuit card or printed circuit board without the use of mechanical fasteners.

Personal computers utilize substrates such as circuit cards and printed circuit boards within the computer chassis to interconnect with other electrical components and peripherals, such as modems. The substrates may be used by consumers or manufacturers to provide additional functional capabilities to an existing personal computer or computer system. As an example, substrates such as circuit cards may be used to provide standard bus interfaces for peripheral devices, such as audio and video devices, tape controllers, modems and other peripherals. Still further substrates such as network circuit cards may be secured to the computer chassis by the backplate, for the purpose of providing modem and/or communication capabilities to the computer.

Typically, circuit cards and other circuit carrying substrates are made available to the manufacturer or consumer as assemblies with the backplate attached to the substrate, so that the consumer and/or manufacturer need only attach the backplate to the computer chassis to secure the substrate in the computer. The backplate and substrate are usually assembled using manual assembly lines. As known in the art, at least two sets of mechanical fasteners are needed to secure the backplate to the substrate. In light of the large number of substrate assemblies that are manufactured, use of mechanical fasteners to secure substrates with backplate adds substantial labor and material expenses to the production cost.

In addition, the circuitry on the substrate often require a chassis ground which may be provided by the backplate. However, the known art lacks an efficient and secure method of employing the backplate as the chassis ground to the substrate. Mechanical fasteners are not always retained or precisely fitted into the substrate to interconnect the ground of the substrate with the backplate. Moreover, manually aligning the fasteners to ground the substrate requires additional labor and/or equipment costs.

These and other shortcomings of the known art are addressed with this invention.

SUMMARY OF THE INVENTION

In one preferred embodiment of the present invention, a backplate is provided having an elongated section orthogonally joined to a top section. The backplate includes a first tab set having a first and second tab extending from the elongated section. The first and second tabs are longitudinally offset and laterally spaced apart from one another to define a slot for retaining a substrate. The first tab includes a first tang that extends into the slot for engaging a fastener hole of the substrate being inserted thereon.

The embodiment may also include a second tab set having a first and second tab extending from an edge of the elongated section. The first tabs of each tab set further include a distal surface for contacting a grounding plane adjacent to the fastener hole on the substrate.

In an another embodiment of the invention, the backplate includes an elongated section, and a top section orthogonal to the elongated section for securing the backplate to the computer chassis. A first and second tab set align longitudinally on the elongated section. Each tab set includes at least a first tab and a second tab extending from the elongated section, the first and second tabs of each tab set being longitudinally offset and laterally spaced apart to define a slot for retaining a substrate. The first tab of each tab set includes a first tang that extends into the slot for engaging a fastener hole on the substrate, and a distal contact surface for contacting a grounding plane on the substrate. The second tab of each tab set is curved to have a maximum deflection region extending into the slot and a rounded end that combines with the first tab to form an enlarged mouth for the slot.

The embodiment may also provide the first and second tab set to be positioned longitudinally along an edge of the backplate so that the first tabs of the first and second tab set contact a corresponding grounding plane on the top and bottom of the substrate. The first and second tabs of each tab set may also be sufficiently resilient, to expand upon receiving the substrate inserted therebetween.

In still another embodiment of the invention, the backplate includes an elongated section, and a top section orthogonal to the elongated section for attaching the backplate to the computer chassis. A first and second tab set align longitudinally on the elongated section. Each tab set includes at least a first tab and a second tab extending from the elongated section, the first and second tabs of each tab set being longitudinally offset and laterally spaced apart to define a slot for retaining the substrate. The first tab of each tab set includes a first tang that extends into the slot for engaging a first fastener hole on the substrate, and a distal contact surface contacting a grounding plane on the inserted substrate. The second tab of each tab set includes a second tang that extends into the slot for engaging a second fastener hole on the substrate.

The embodiment may also provide for the first and second tab set to be positioned longitudinally along an edge of the backplate so that the first tabs of the first and second tab set contact a corresponding grounding plane on the top and bottom of the substrate. The first and second tabs of each tab set may be sufficiently resilient to expand upon receiving the substrate inserted therebetween. The embodiment may also provide for additional tab sets. Each of the tab sets may include additional tabs extending from the elongated section.

In still another embodiment of the present invention, a network card assembly is provided with the backplate for communications with a network. Moreover, the features described with the variations of this invention are interchangeable between the various embodiments.

DESCRIPTION OF THE PRESENTLY PREFERRED EMBODIMENTS

This invention provides a backplate for retaining substrates such as circuit cards in a computer chassis. The backplate improves over the prior art by providing unitary structural features for retaining the substrate without mechanical fasteners. As such, the backplate of this invention may be secured to the substrate more readily than other backplates known in the art. In addition, the backplate of this invention avoids labor costs and material expenses associated with employing mechanical fasteners to secure the substrate to the backplate. Another advantage of the present invention is that the substrate and backplate may be engaged tactilely Such that the substrate "snaps" into a secure position. The tactile engagement readily verifies securement of the substrate with the backplate during manual assembly. These and other advantages of this invention will be made clear below.

Figure 1:
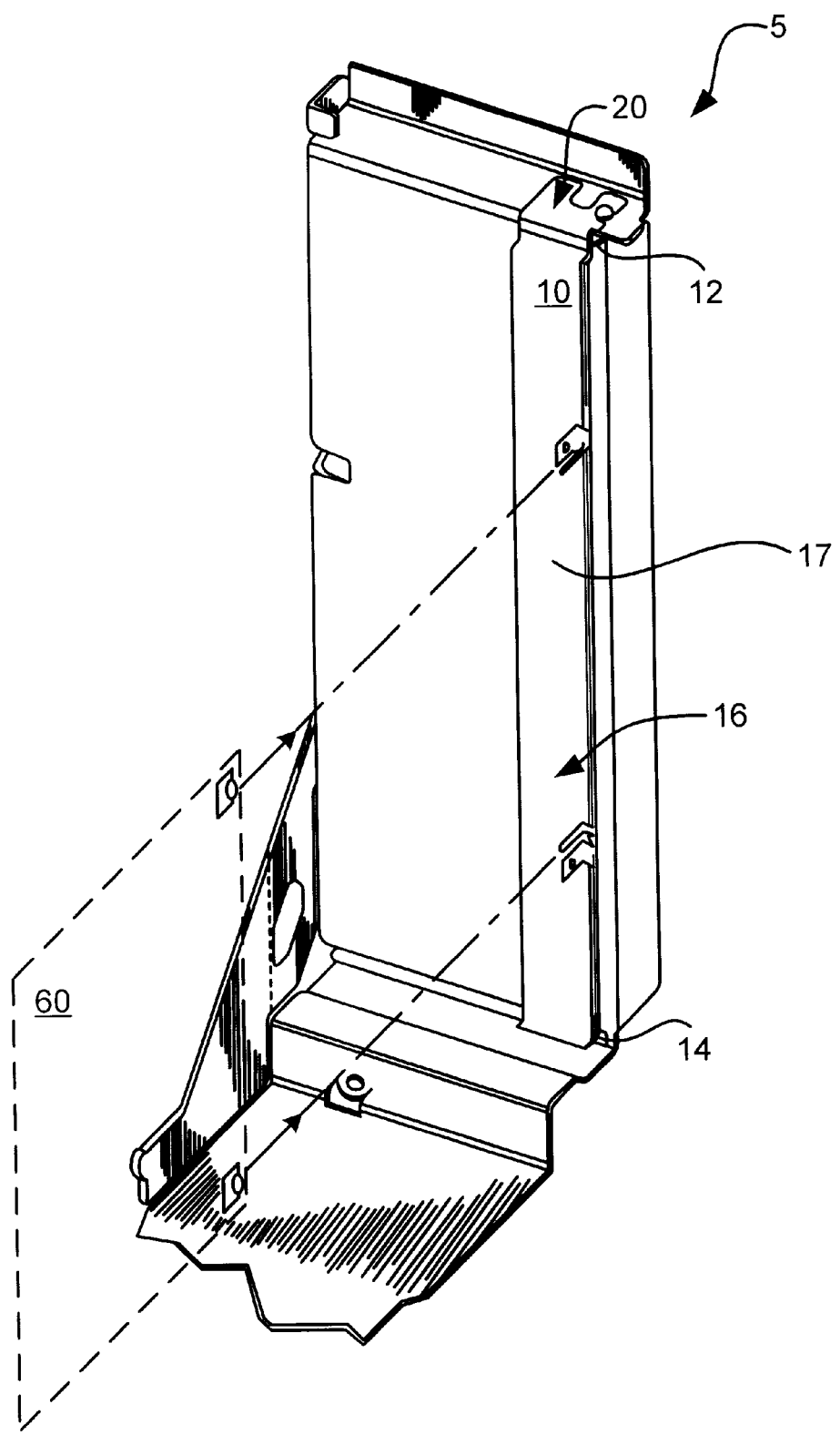
FIG. 1 is an isometric perspective of a backplate of the first preferred embodiment secured to a computer chassis, with a substrate for use in the preferred embodiment shown in phantom.

FIG. 1 shows a first preferred embodiment of the present invention comprising one piece backplate 10 for receiving a substrate 60 (shown in phantom). The backplate is referenced with respect to a longitudinal axis extending between a top edge 12 and a bottom edge 14. The top edge 12 orthogonally joins a top section 20 with an elongated section 16. The top section 20 receives one or more fasteners to mount the backplate to a computer chassis 5. The elongated section 16 includes a front face 17 for securing the substrate, and a back face 19 (shown in FIG. 7) that abuts the chassis 5 once the backplate is secured. The backplate retains the substrate to the front face 17 in a fixed position for electrical communication with the motherboard and other computer circuitry.

Figure 2:
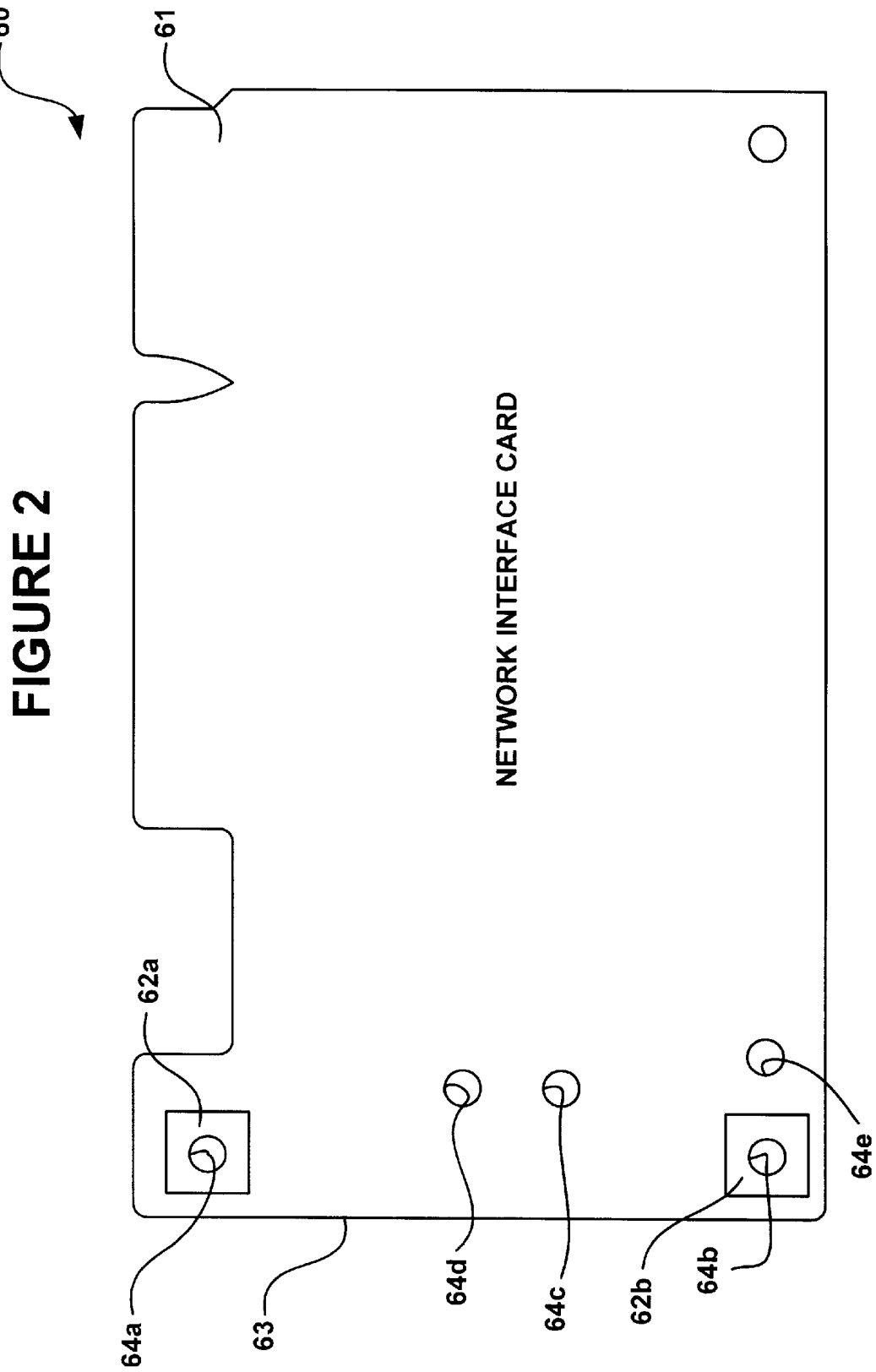
FIG. 2 is a front view of the substrate preferred with this invention.

FIG. 2 shows the substrate for use with the preferred embodiment being a circuit card 60. The network circuit card includes a rectangular substrate 61 that secures edgewise to the backplate 10 (FIG. 1), so that both planar sides of the substrate may be fully accessible for electrical communication. The network circuit card may be manufactured for a variety of uses and may differ in mechanical and electrical design, including providing circuitry on one or both sides of the substrate. In the preferred embodiment, the circuit card is a network interface circuit card for interfacing or communicating with a network such as the Internet. The substrate also include grounding planes 62a, 62b for grounding the circuit card with the computer chassis. The grounding planes 62 are generally positioned at the top and bottom corners of the corners near an edge 63 secured to the backplate. The substrate 61 may also include two or more fastener holes 64a and 64b for receiving fasteners that secure the circuit card with the backplate. Other fastener holes 64c–e may also be used with this invention. At least two of the fastener holes 64 are typically located immediately adjacent to the grounding planes 62 and in proximity to the edge 63. While the preferred embodiment is described with respect to circuit cards, and more particularly network circuit cards, this invention may be used with any substrate having circuitry or electrical components mounted to a substrate, including printed wiring boards and printed circuit boards.

Figure 3:
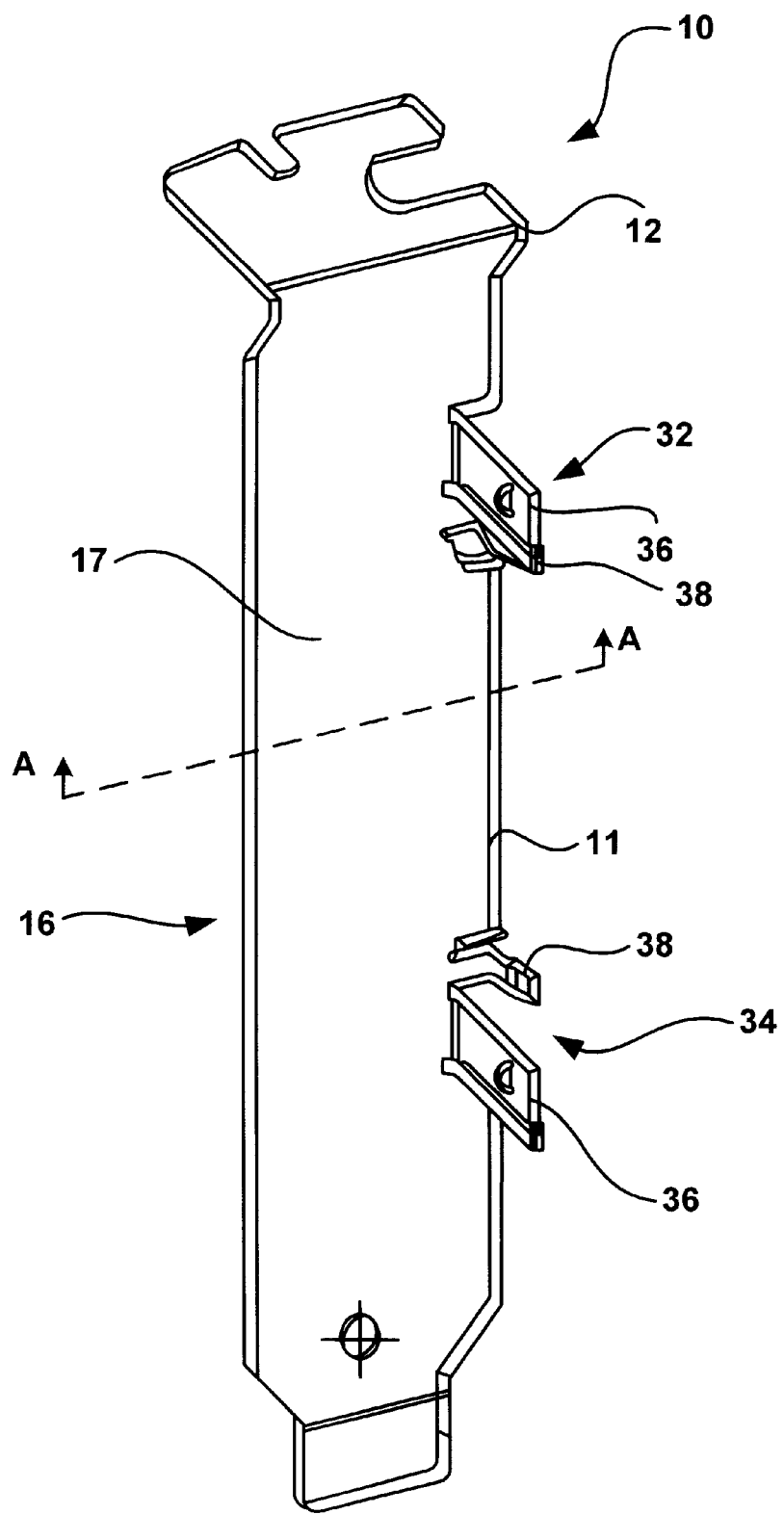
FIG. 3 is an isometric perspective of the first embodiment of this invention.

With reference to FIG. 3, the first preferred embodiment is shown to include a top and bottom tab set 32 and 34 extending from the front face 17 of the elongated section 16 along an edge 11. Each tab set includes at least two tabs for engaging the grounding plane 62 (FIG. 2) while supporting the substrate in a fixed position. While two tab sets are preferred, it should be readily apparent to one skilled in the art that more or less tab sets may be used under this invention to secure the circuit card 60 to a computer chassis.

Each tab set of the first preferred embodiment includes a ground contact tab 36 and support tab 38. The ground contact tab 36 and support tab 38 are staggered along an edge of the backplate 10, so that each tab is longitudinally offset and laterally spaced from one another. Preferably, the support tabs 38 of the respective tab set 32 and 34 are oriented to be closer to the center line of the elongated section 16. As will be described in further detail, the ground contact tab 36 may be dimensioned to contact the grounding planes 62 of the circuit card.

Figure 4:
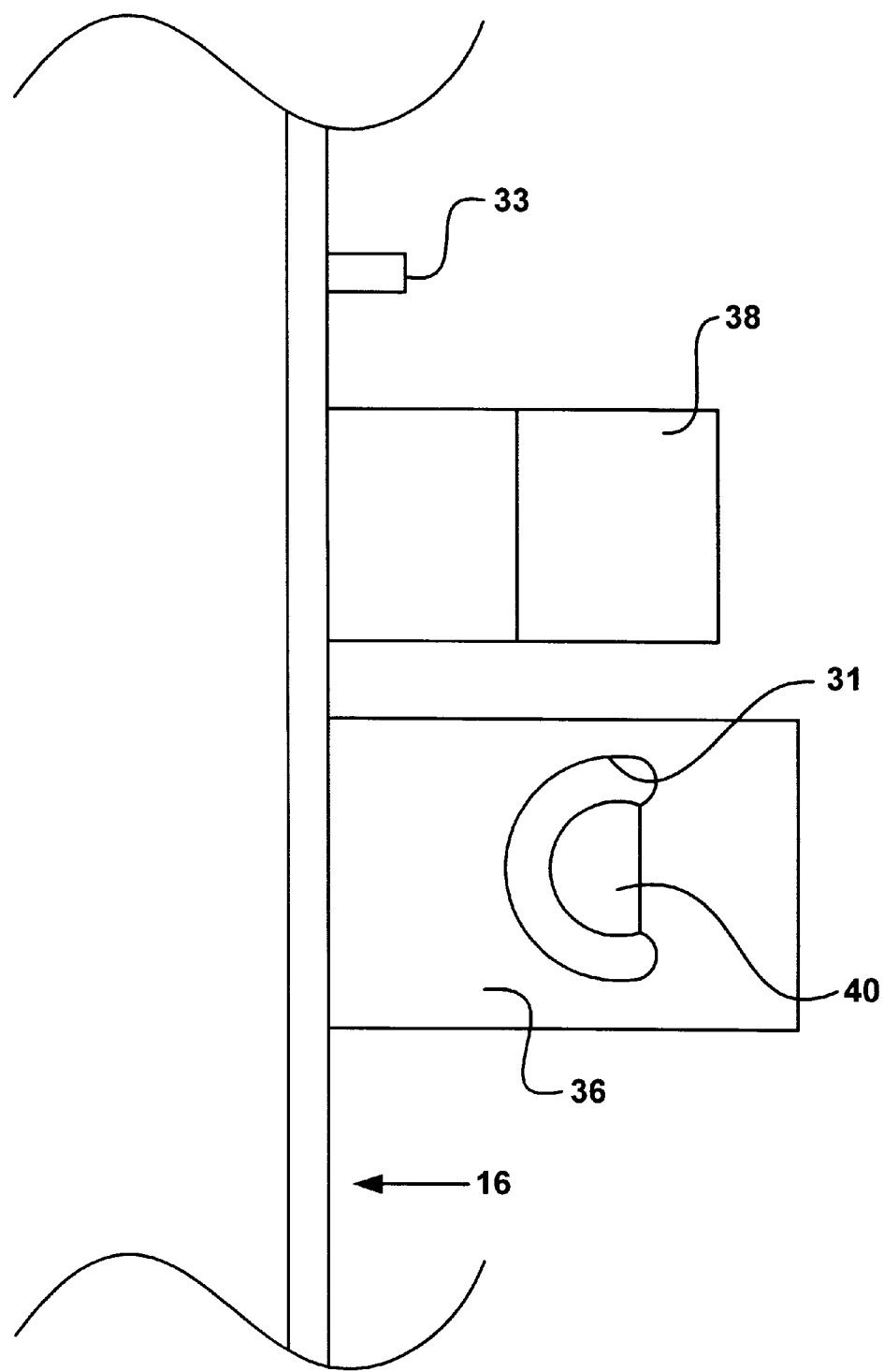
FIG. 4 is a close-up front view of a bottom tab set of FIG. 3.

FIG. 4 is a close-up of the bottom tab set 34 shown in FIG. 3. The support tab 38 may be positioned to be relatively closer to the center line of the elongated section 16. One or more protrusions 33 are aligned longitudinally between the top and bottom tab sets to space and support the circuit card upon insertion. The ground contact tab 36 is also shown to include a tang 40 and an opening 31 defined by the tang.

Figure 5:
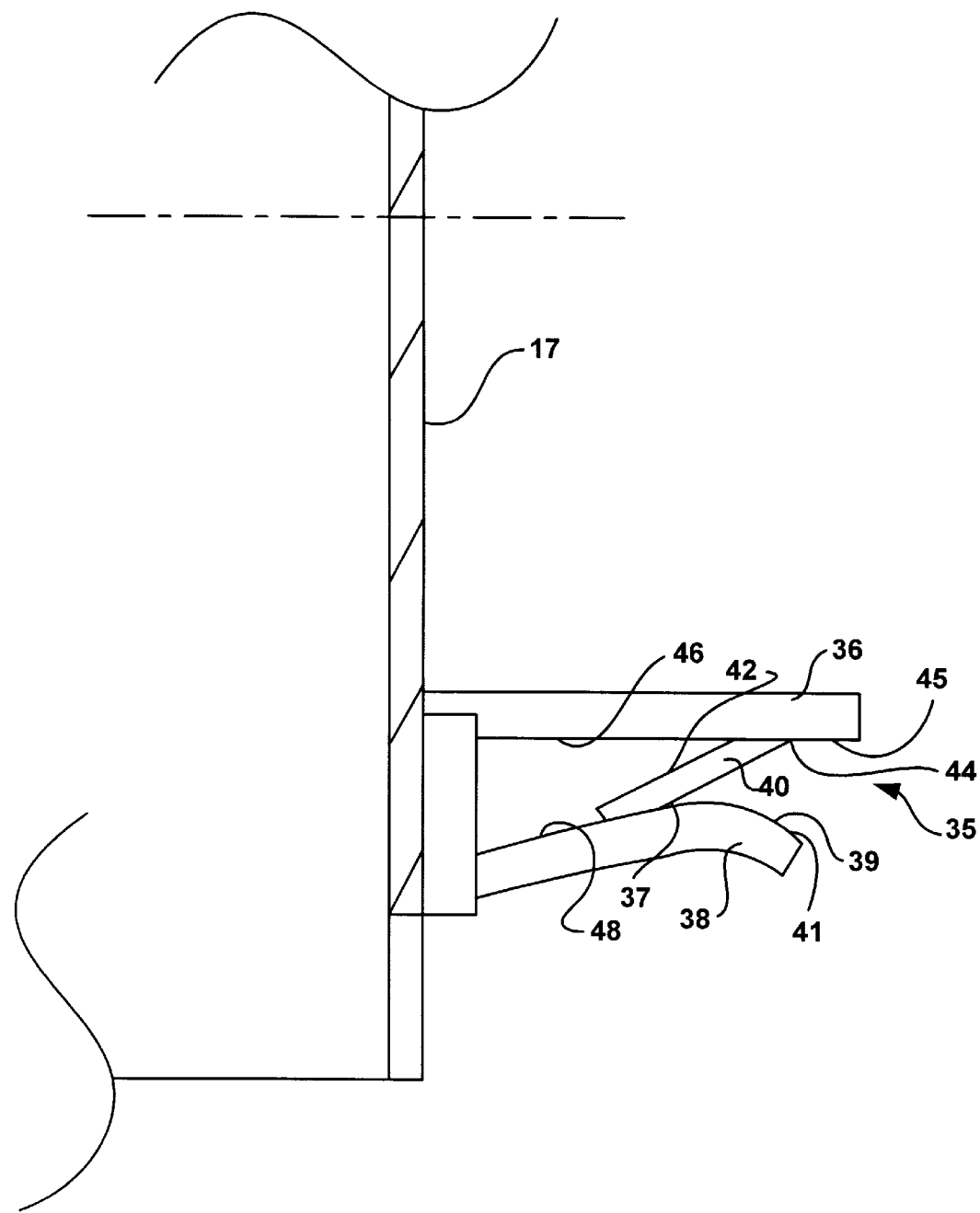
FIG. 5 is a sectional view along lines A—A of FIG. 3

FIG. 5 is a cross-section cut along lines A—A of FIG. 3 which shows the staggered arrangement of the ground contact tab 36 and support tab 38 along the front face 17. With more detail, the support tab 38 is shown as being curved to concave away from the ground contact tab 36. The curvature of the support tab 38 includes a maximum deflection region 37 and a rounded distal segment 39 or end. A slot 35 is defined by the staggered tabs and is laterally dimensioned to receive and friction fit the circuit card. As shown in two dimensions by FIG. 5, the rounded distal segment 39 forms an enlarged mouth 41 with the ground contact tab 36 on a distal end of the slot 35. The slot 35 is further provided a narrow friction fit space at the maximum deflection region 37, where an interior side 48 of the support tab 38 is in closest proximity to an interior side 46 of the ground contact tab 36. The enlarged mouth 41 serves to increase the tolerance for fitting the circuit card 60 (FIG. 2) to the backplate during assembly. Thus, the tolerance provided by the enlarged mouth 41 may also be increased or decreased by changing the curvature of the support tab 38. Similarly, the distance between the maximum deflection region 37 and the ground contact tab 36 may be altered by the curvature and/or position of the support tab 38 to accommodate circuit cards or circuit carrying substrates of varying thicknesses.

With further reference to FIG. 5, the tang 40 includes a base (not shown) extending from the ground contact tab 36. The tang 40 includes a planar tip 42 positioned within the slot 35 and preferably resting against interior side 48 of support tab 38. The tang 40 is preferably resilient when planar tip 42 is pressed towards the ground contact tab 36. Therefore, insertion of the circuit card into slot 35 pushes tang 40 to bias planar tip 42 towards support tab 38. The resilient tang 40 of each tab set 32, 34 (as shown by FIG. 3) may then release from the biased position to engage fastener holes on the circuit card being inserted therein. In the preferred embodiment, tang 40 releases to engage the corresponding fastener holes 64a, 64b located immediately adjacent to respective grounding pads 62a, 62b of the circuit card in FIG. 2. The tang 40 may extend either through or partially into the corresponding fastener holes to help secure the circuit board within the slot 35. Once engaged, the tang 40 is preferably angled within the fastener hole of the substrate to prevent reverse motion of the substrate. The tang 40 may also be dimensioned in width or length to contact the substrate 61 (FIG. 2) at its midportion between a base 44 and the planar tip 42. The resilient tang 40 may then be biased to press against the substrate and further secure the circuit card within the slot 35.

Preferably, the slot 35 is of sufficient width to allow the support tab 38 and ground contact tab 36 of each tab set 32, 34 to frictionally secure the inserted circuit card once the respective tang 40 is engaged with the corresponding fastener holes 64a, 64b. The ground contact tab 36 and the support tab 38 may also be resilient so that slot 35 expands when the circuit card is inserted therein. To secure the circuit card, the maximum deflection region 37 of each support tab 38 is dimensioned such that it extends into the slot 35 and firmly presses against the substrate. In this manner, the support tab 38 and ground contact tab 36 may combine to provide opposing support to the inserted circuit card, with the respective supportive forces longitudinally offset so as to be distributed over a greater area on both sides of the substrate.

Once the circuit card is inserted into the slot 35 and secured, the ground contact tab 36 of each tab set 32, 34 preferably contacts the grounding plane 62a, 62b on the substrate 61 (FIG. 2). The contact between the respective ground contact tab 36 and grounding plane 62 of the substrate provides a chassis ground for the circuit card. As shown by FIG. 2 and previously discussed, the circuit card preferred by this invention has grounding planes 62a, 62b immediately adjacent to the fastener holes 64a, 64b and distal from the elongated section 16. Accordingly, a distal surface 45 of the interior side 46 of each ground contact tab 36 contacts the corresponding grounding plane 62 on the substrate 61, so that a chassis ground is provided by the ground contact tab 36 of each tab set 32, 34.

Figure 6:
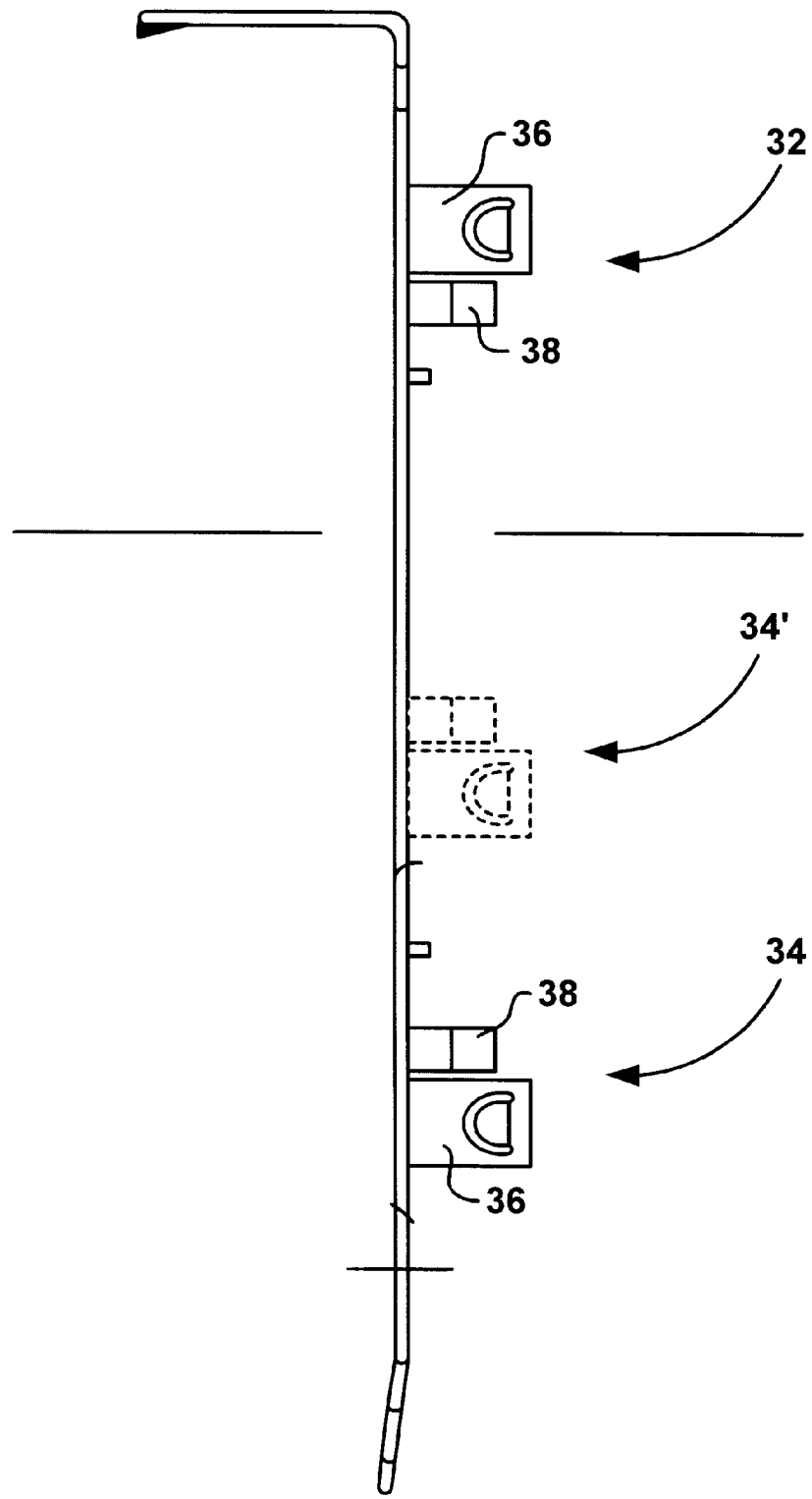
FIG. 6 is a side view of the first embodiment of this invention.

FIG. 6 shows the longitudinal position of the top tab set 32 and bottom tab set 34 as determined by the position of the grounding planes 62 and/or fastener holes 64 of the particular circuit card being employed with the backplate. The preferred arrangement of FIG. 6 is aligned to receive the circuit card having grounding planes and holes at a top and bottom edge. In another variation, the ground contact tab 36 and support tab 38 may be reversed in their position from the longitudinal centerline. Moreover, it should be readily apparent that the top tab set 32 and bottom tab set 34 may each be moved closer to the center line of the elongated section 16 if necessitated by the design of the circuit card. The invention may also provide addition and/or alternative tab sets such as bottom tab set 34', shown in phantom.

Figure 7:
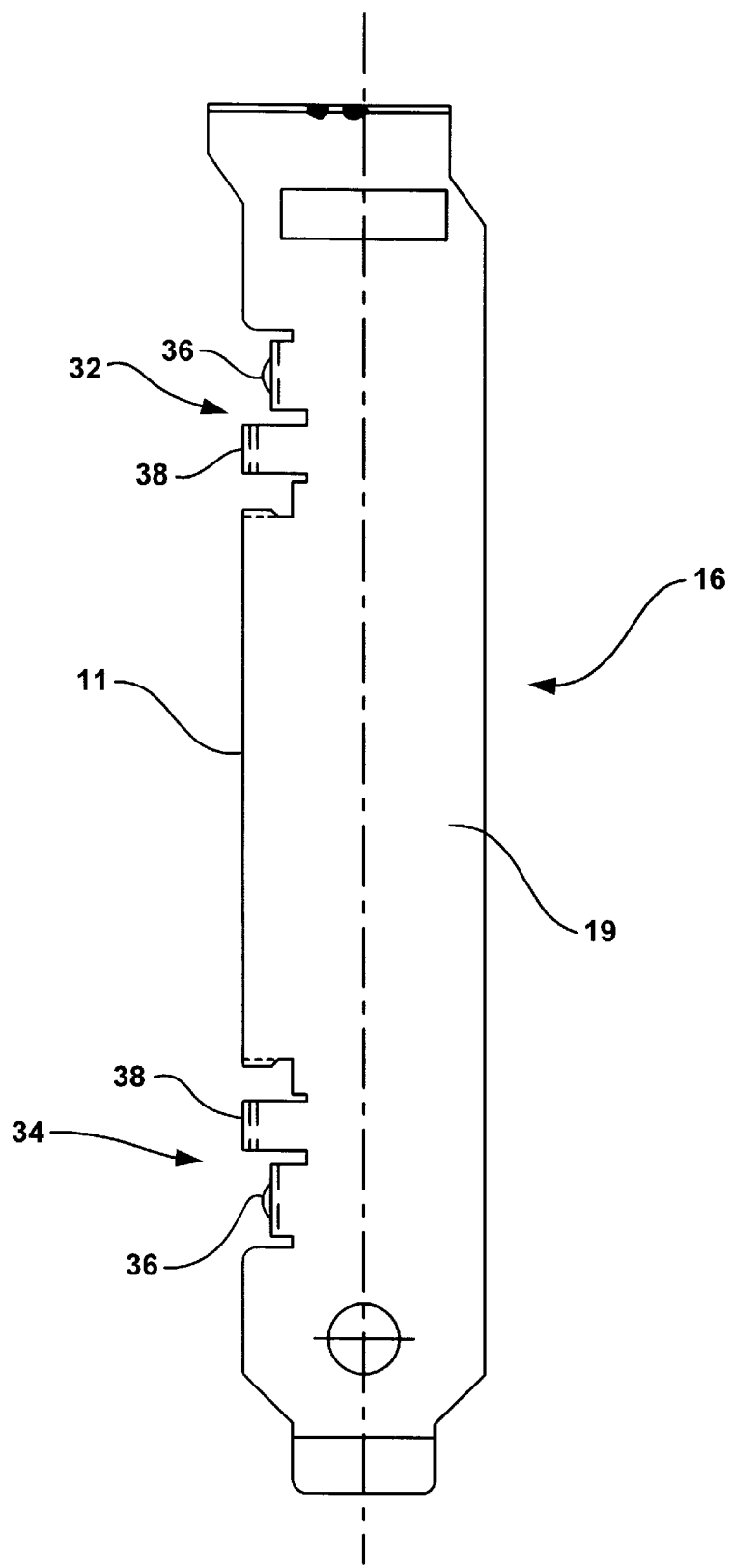
FIG. 7 is a back view of the first embodiment of this invention.

FIG. 7 shows the back face 19 of the elongated section 16 to further illustrate the staggered arrangement of the each ground contact tab 36 and support tab 38 within respective top and bottom tab set 32 and 34. As previously described, the top and bottom tab sets 32 and 34 preferably extend from an edge of the elongated section 16. The support tab 38 and ground contact tab 36 of each tab set may be staggered by indenting the edge of the elongated section 16 to position the ground contact tab 36 further inwards with respect to the support tab 38.

Accordingly, the structure of the first preferred embodiment may be practiced in the following manner. The circuit card is manually inserted into the slot 35. The enlarged mouth 41 of each tab set guides the circuit card into the respective slots 35. The ground contact tab 36 and support tab 38 of each tab set may be dimensioned to expand as the substrate engages the maximum deflection region 37 of the respective support tab 38. The tangs 40 of each tab set are resiliently depressed against the ground contact tab 36 to accommodate the circuit card. Once each of the tangs 40 engage corresponding fastener holes 64a, 64b on the substrate, the tangs 40 release to secure the circuit at the top and bottom end. The release of the tangs 40 provide the "snap" feature of this invention. The respective ground contact tab 36 and support tab 38 of each tab set may then combine to frictionally retain and secure the circuit card within the slot 35.

Figure 8:
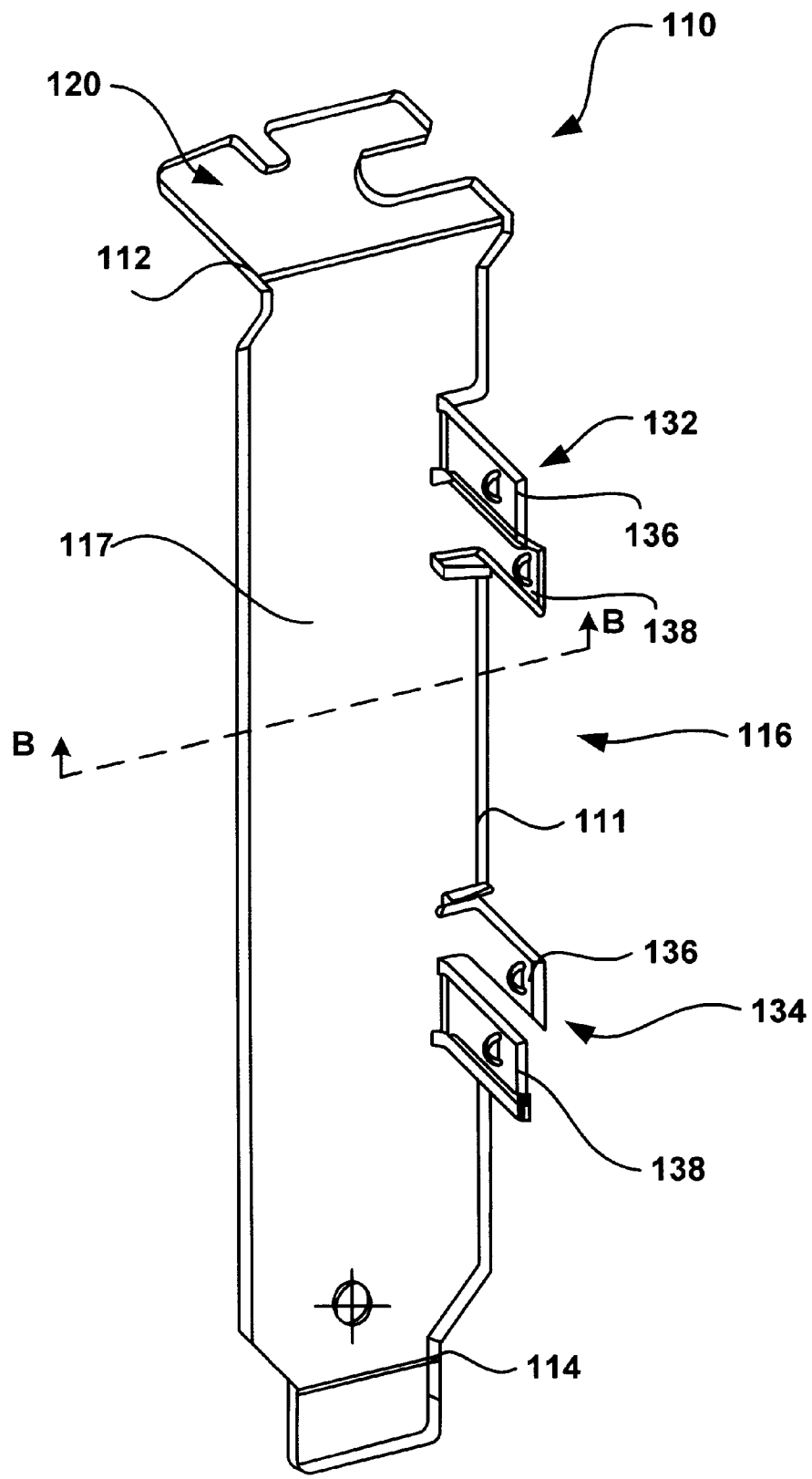
FIG. 8 an isometric perspective of the second embodiment of this invention.

FIG. 8 shows a second preferred embodiment of this invention, including a one piece backplate 110 having an elongated section 116 and a top section 120. As with the first embodiment, the backplate 110 may be referenced with respect to a longitudinal axis extending between a top edge 112 and a bottom edge 114. The top edge 112 orthogonally joins the top section 120 and elongated section 116. The top section 120 receives one or more fasteners to mount the backplate to a computer chassis 5 (as shown by FIG. 1). The elongated section 116 includes a front face 117 for securing the circuit card 60 (FIG. 2), and a back face 119 (FIG. 12) that abuts the chassis of the computer once the backplate is secured. Similarly, the backplate retains the circuit card 60 to the front face 117 in a fixed position for electrical communication with the motherboard and other computer circuitry.

The backplate 110 of the second embodiment includes a top and bottom tab set 132 and 134 extending from an edge 111. Each tab set includes at least two tabs for engaging the grounding plane while Supporting the substrate in a fixed position. While two tab sets are preferred, it should be readily apparent to one skilled in the art that more or less tab sets may be used with the second embodiment to secure the circuit card 60 (FIG. 2) relative to a computer chassis.

Each tab set of the second preferred embodiment includes a first and second contact tab 136 and 138. The contact tabs 136 and 138 are staggered along an edge of the backplate 110, so that each tab is longitudinally offset and laterally spaced from one another.

Figure 9:
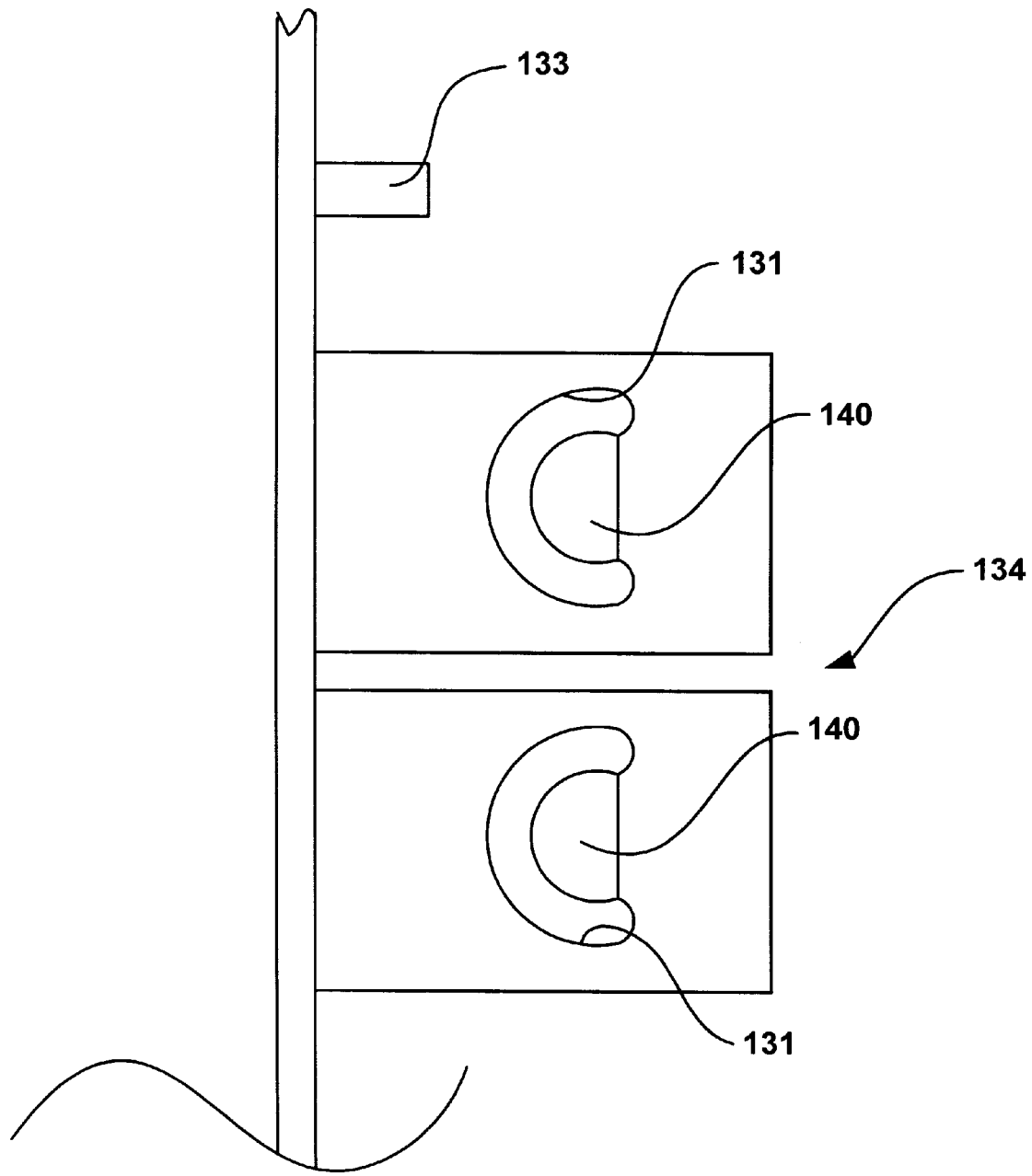
FIG. 9 is a close-up front view of a bottom tab set of FIG. 8.

FIG. 9 is a close-up of the bottom tab set 134. One or more protrusions 133 are aligned longitudinally between the top and bottom tab sets 132 and 134 to space and support the inserted circuit card. Each contact tab includes a tang 140 that extends laterally with respect to the elongated section 116. The tangs 140 provide respective openings 131 on each of the contact tabs.

Figure 10:
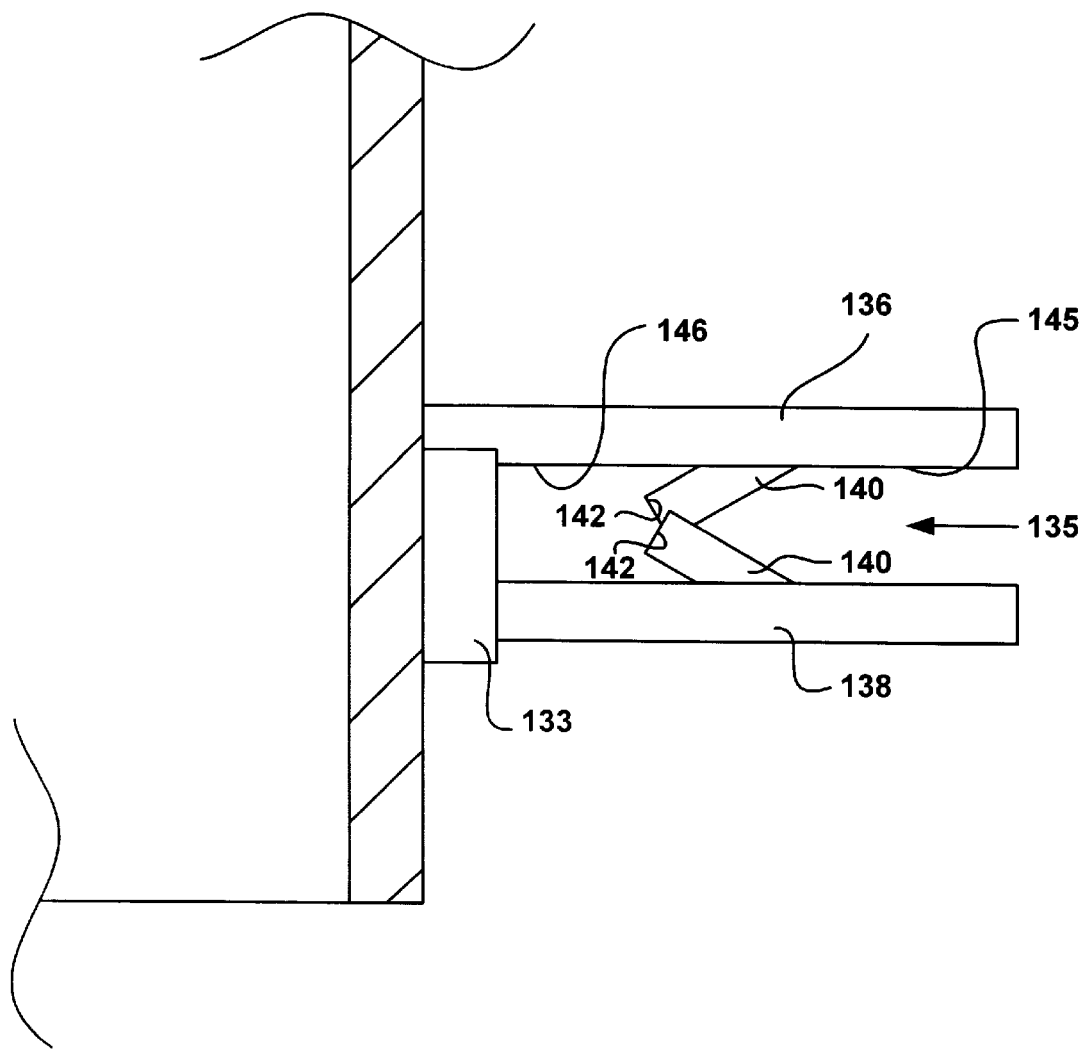
FIG. 10 is a sectional view along lines B—B of FIG. 8.

FIG. 10 is a cross-section cut along lines B—B of FIG. 8 which shows the staggered arrangement of the contact tabs 136 and 138 along the front face 117. A slot 135 is defined by the staggered tabs and is laterally dimensioned to receive and friction fit the circuit card. FIG. 10 also shows that the tangs 140 of each contact tab include a base (not shown), and a corresponding planar tip 142 positioned within the slot 135. Each of the tangs 140 are preferably resilient when planar tip 142 is pressed towards the respective contact tabs 136, 138. Therefore, insertion of the circuit card 60 (FIG. 2) into slot 135 pushes both tangs 140 and biases the corresponding planar tips 142. The resilient tangs 140 may then release from the biased position to allow each planar tip 142 to engage fastener holes 64a, 64b (as shown in FIG. 2) on the circuit card 60 being inserted therein. While the preferred embodiments secure to fastener holes 64a, 64b positioned at the corners of the substrate adjacent edge 63, it should be readily apparent that additional contact tabs may be deployed to contact fastener holes 64c, 64d, and 64c, as shown in FIG. 2. The tangs 140 may extend either through or partially into the respective fastener holes to help secure the circuit board within the slot 135. Once engaged, the tangs 140 are preferably angled within the respective grounding hole of the substrate to prevent reverse motion of the substrate. The tangs 140 may also be dimensioned in width or length so that each tang contacts the substrate at its midportion between the base and the planar tip 142. The resilient tang 140 may then each be biased to press against the substrate and further secure the circuit card within the slot 135.

Preferably, the slot 135 is of sufficient width and resiliency to allow contact tabs 136 within each of the tab sets 132, 134 to combine and frictionally secure inserted circuit card once tangs 140 are engaged into the fastener holes 64a, 64b. In this manner, the contact tabs 136 and 138 may combine to provide opposing support to the inserted circuit card, with the respective supportive forces longitudinally offset so as to be distributed over a greater area on both sides of the substrate.

Once the circuit card is inserted into the slot 135 and secured, one or both of the contact tabs 136, 138 of each tab set preferably contacts the grounding plane 62a, 62b on the circuit card 60 (FIG. 2). The contact between the contact tabs 136, 138 of each tab set 132, 134 and the grounding plane 62a, 62b provides a chassis ground for the circuit card of FIG. 2. Accordingly, a distal surface 145 on an interior side 146 of one or both of the contact tabs in each of the tab sets 132, 134 may extend to ground planes 62a, 62b. As noted, only one of the contact tabs 136, 138 of the respective top or bottom tab set 132, 134 may be positioned to contact the grounding plane of the circuit card, while the other simply provides for the respective tang to engage another hole 64c, 64d, 64e in the substrate 61 (as shown by FIG. 2). In this instance, the other contact tab 138 of the respective tab set serves to further secure the circuit card within the slot 135 by engaging the corresponding tang 140 in a hole of the substrate. As such, the two contact tabs 136, 138 of the tab sets 132, 134 combine to firmly press the inserted circuit card once the tangs 140 are engaged.

Figure 11:
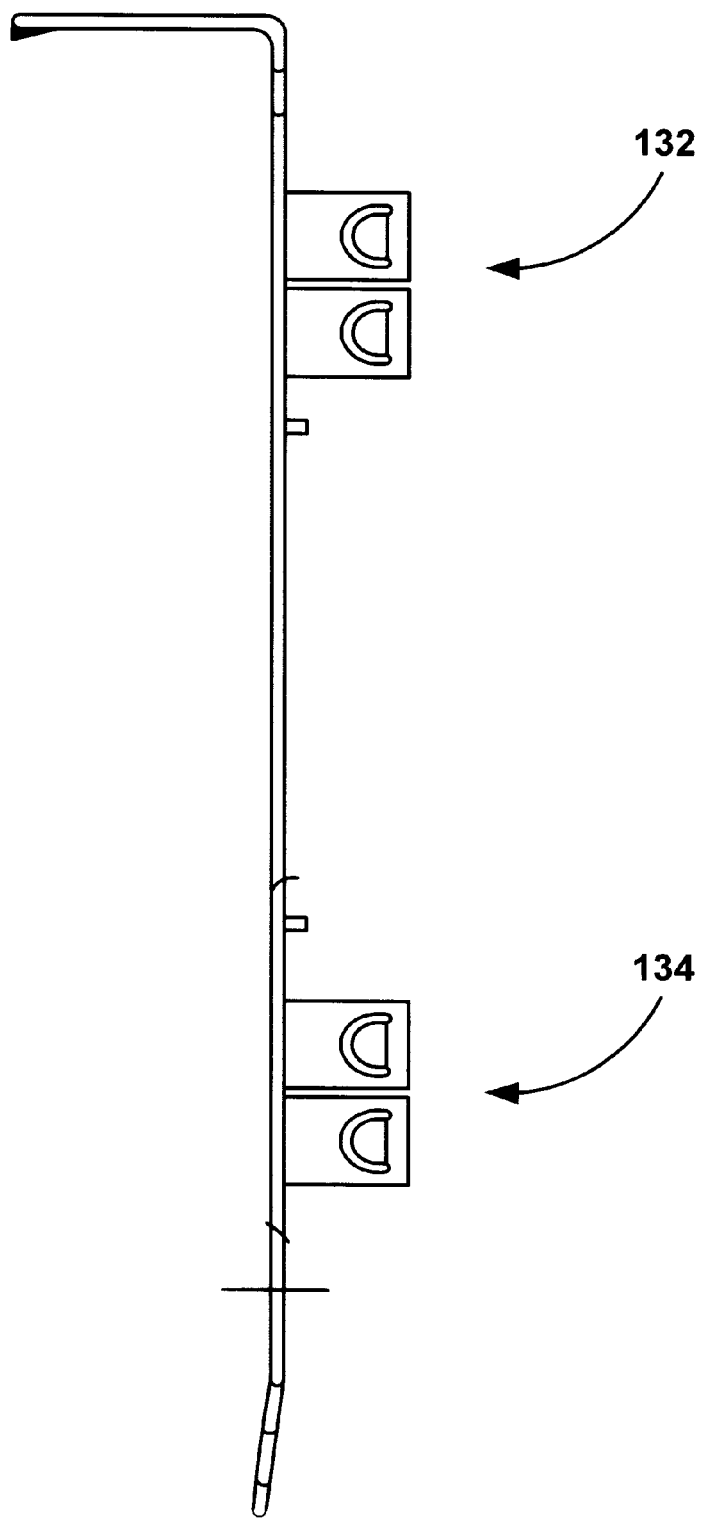
FIG. 11 is a side view of the second embodiment of this invention.

FIG. 11 shows the longitudinal position of the top tab set 132 and bottom tab set 134 may be determined by the position of the backplate. The preferred arrangement of the second embodiment shown by FIG. 11 is aligned to receive the circuit card having grounding planes 62 and fastener holes 64a, 64b at a top and bottom edge. However, as with the first embodiment, it should be readily apparent that the top tab set 132 and bottom tab set 34 may each be moved closer to the center line of the elongated section 116 if necessitated by the design of the circuit card. Additional tab sets may be provided with this embodiment, as shown by FIG. 6.

Figure 12:
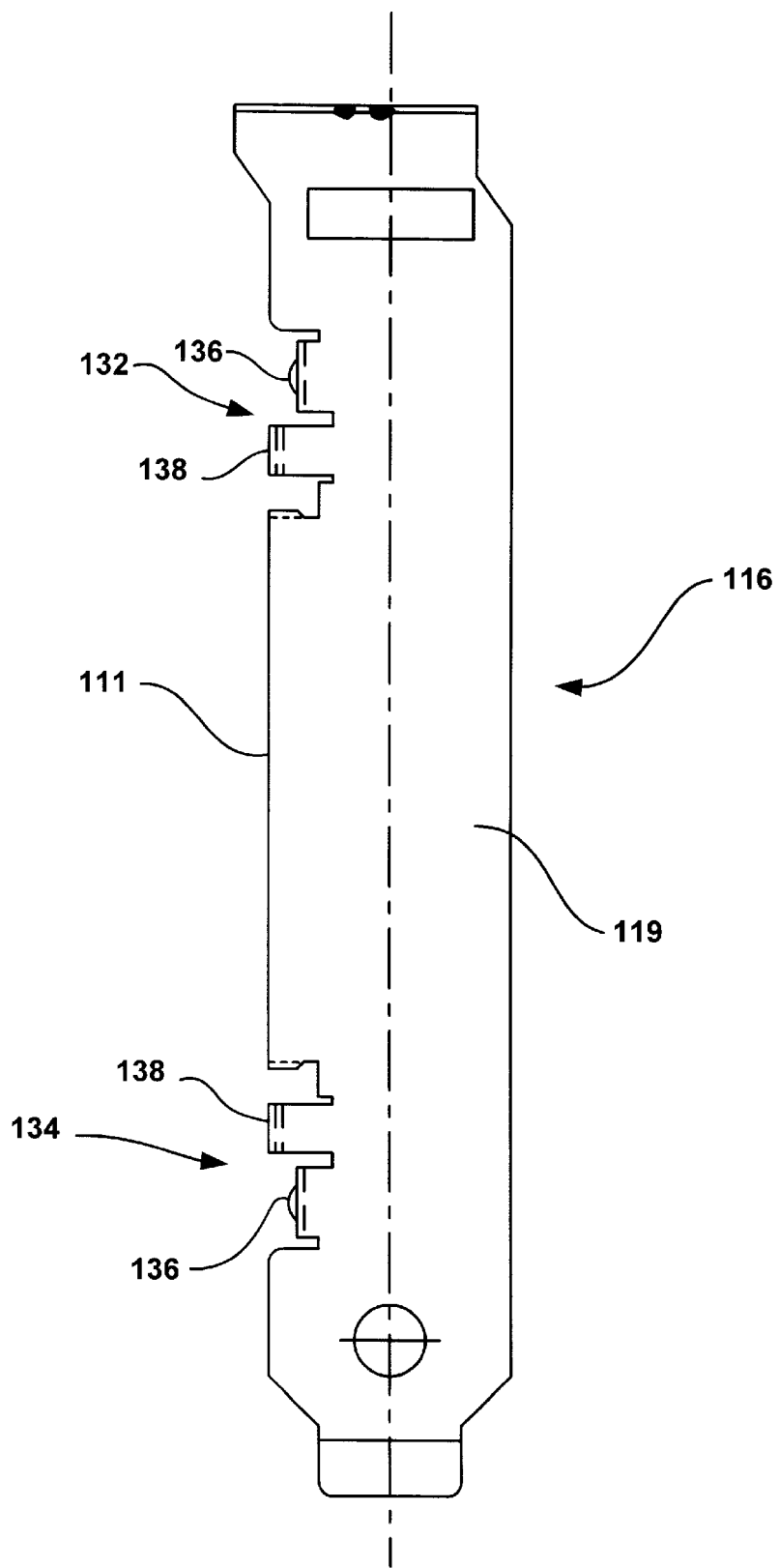
FIG. 12 is a back view of the second embodiment of this invention.

FIG. 12 shows the back face 119 of the elongated section 116 to further illustrate the staggered arrangement of the each contact tab 136, 138 within respective top and bottom tab set 132 and 134. As previously described, the top and bottom tab sets 132 and 134 preferably extend from the edge 111 of the elongated section 116. The contact tabs 136, 138 of each tab set may be staggered by indenting the edge of the elongated section 116 to position the one of the contact tabs 136 further inwards with respect to the other.

Accordingly, the structure of the second preferred embodiment may be practiced in the following manner. The circuit card is manually inserted into the slot 1 35. The contact tabs 136, 138 of each tab set may be dimensioned to expand as the substrate enters the respective slot 135. The tangs 140 are resiliently depressed against the respective ground contact tab 136 to accommodate the circuit card. Once the tangs 140 engages fastener holes 64a, 64b on the substrate, the tangs 140 releases so that the circuit card is fixed at the top and bottom ends. The release of the tangs 140 provides the "snap" feature of this invention. The contact tabs 136, 138 of the respective top and bottom tab set 132, 134 may then combine to frictionally retain the circuit card within the slot 135.

Preferably, the embodiments of this invention are formed from metals, including "301 stainless steel ½ hard", or "cold roll steel" manufactured by Thomas Steel Strip. The backplate s may be manufactured by methods known in the art, including hard and soft tooling.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical applications, thereby enabling others skilled in the art to understand the invention for various embodiments and with various modifications as are suited to the particular use contemplated. It is intended that the scope of the invention be defined by the following claims and their equivalents.

What is claimed is:

1. A backplate for retaining a substrate to a computer chassis, comprising:
   a body having an elongated section, and a top section orthogonal to the elongated section for attaching the backplate to the computer chassis;
   a first tab set having a first and second tab, each tab extending from the elongated section, the first and second tabs being longitudinally offset and laterally spaced apart to define a longitudinal slot for retaining the substrate; and
   a first biased tang that is extended laterally from the first tab to engage a fastener hole of the substrate.

2. The backplate of claim 1, wherein the second tab of each tab set is curved to have a maximum deflection region extending into the slot and a rounded end that combines with the first tab to form an enlarged mouth for the slot.

3. The backplate of claim 1, wherein the second tab includes a second tang that extends into the slot for engaging a fastener hole of the inserted substrate.

4. The backplate of claim 1, wherein the substrate forms a network circuit card.

5. The backplate of claim 1, further comprising a second tab set having a first and second tab extending from the elongated section.

6. The backplate of claim 5, wherein the tabs of the first and second tab sets extend from an edge of the elongated section.

7. The backplate of claim 5, wherein the first tabs of each tab set further include a distal surface for contacting a grounding plane adjacent to the fastener hole on the substrate.

8. The backplate of claim 5, wherein the second tabs of each tab set include a distal surface for contacting a grounding plane adjacent to the fastener hole on the substrate.

9. The backplate of claim 5 further comprising additional tab sets.

10. The backplate of claim 5, wherein each tab set includes more than two tabs extending from the elongated section.

11. A backplate for retaining a substrate to a computer chassis, comprising:
   a body having an elongated section and a top section orthogonal to the elongated section for attaching the backplate to the computer chassis;
   a first and second tab set aligned longitudinally on the elongated section;
   each tab set having at least a first tab and a second tab extending from the elongated section, the first and second tabs of each tab set being longitudinally offset and laterally spaced apart to define a slot for retaining the substrate;
   said first tab of each tab set including a first tang that extends into the slot for engaging a fastener hole on the substrate, and a distal contact surface for contacting a ground plane on the substrate; and
   said second tab of each tab set being curved to have a maximum deflection region extending into the slot and a rounded end that combines with the first tab to form an enlarged mouth for the slot.

12. The backplate of claim 11, wherein the first and second tabs of each tab set are sufficiently resilient to expand upon receiving the substrate inserted therebetween.

13. The backplate of claim 11, wherein the substrate is a network circuit card.

14. The backplate of claim 11, wherein the first and second tab set are positioned longitudinally along an edge of the backplate so that the first tabs of the first and second tab set contact a corresponding grounding plane on the top and bottom of the substrate.

15. The backplate of claim 14, further comprising additional tab sets.

16. The backplate of claim 14, wherein the tab sets include additional tabs extending from the elongated section.

17. A backplate for retaining a substrate to a computer chassis, comprising:
   a body, having an elongated section and a top section orthogonal to the elongated section for attaching the backplate to the computer chassis;
   a first and second tab set aligned longitudinally on the elongated section;
   each tab set having at least a first tab and a second tab extending from the elongated section, the first and second tabs of each tab set being longitudinally offset and laterally spaced apart to define a slot for retaining the substrate;
   said first tab of each tab set including a first tang that extends into the slot for engaging a first fastener hole on the substrate, and a distal contact surface contacting a grounding plane on the inserted substrate; and
   said second tab of each tab set including a second tang that extends into the slot for engaging a second fastener hole on the substrate.

18. The backplate of claim 17, further comprising additional tab sets.

19. The backplate of claim 17, wherein the tab sets include additional tabs extending from the elongated section.

20. The backplate of claim 17, wherein the first and second tab set are positioned longitudinally along an edge of the backplate so that the first tabs of the first and second tab set contact a corresponding grounding plane on the top and bottom of the substrate.

21. The backplate of claim 17, wherein the first and second tabs of each tab set are sufficiently resilient to expand upon receiving the substrate inserted therebetween.

22. The backplate of claim 17, wherein the substrate is a network circuit card.

23. A network circuit card assembly, comprising:
   a substrate having a plurality of fastener holes;
   a backplate having an elongated section, and a top section orthogonal to the elongated section for attaching the backplate to the computer chassis;
   a first tab set having a first and second tab, each tab extending from the elongated section, the first and second tabs being longitudinally offset and laterally spaced apart to define a longitudinal slot for retaining the network circuit card; and
   a first biased tang that is extended laterally from the first tab to engage one of the fastener holes on the substrate of the network circuit card.

24. The network circuit card assembly of claim 23, further comprising a second tab set having a first and second tab extending from an edge of the elongated section.

25. The network circuit card assembly of claim 23, wherein the second tab includes a second tang that extends into the slot for engaging one of the fastener hole on the substrate of the network circuit card.

26. The network circuit card assembly of claim 23, further comprising additional tab sets.

27. The network circuit card assembly of claim 23, wherein each tab set includes more than two tabs extending from the elongated section of the backplate.

28. The network circuit card assembly of claim 23, wherein a grounding plane is adjacent to one of the fastener holes on the substrate of the network circuit card.

29. The network circuit card assembly of claim 28, wherein the second tab of each tab set is curved to have a maximum deflection region extending into the slot and a rounded end that combines with the first tab to form an enlarged mouth for the slot.

30. The network circuit card assembly of claim 28, wherein the first tabs of each tab set further include a distal surface for contacting the grounding plane on the substrate of the network circuit card.

31. The network circuit card assembly of claim 30, wherein the second tabs of each tab set include a distal surface for contacting the grounding plane on the substrate of the network circuit card.

32. A backplate for coupling a substrate to a computer chassis, the backplate comprising:
   an elongate body;
   a plurality of tab sets, each tab set including a plurality of tabs that extend from the elongate body and combine to form a longitudinal slot for retaining the substrate; and
   a plurality of biased tangs, each of the plurality of tangs being laterally extendible from one of the plurality of tabs in each of the plurality of tab sets to engage a fastener hole in the substrate.

33. The backplate of claim 32, wherein the elongate body includes a top section that is orthogonal to the elongated section to attach the back plate to the computer chassis.

34. The backplate of claim 32, wherein each tab set includes a first tab and a second tab, the first tab being enlarged relative to the second tab, the first tab including one of the plurality of tangs.

35. The backplate of claim 32, wherein each tab set is positioned so that at least one of the plurality of tabs makes contact with a grounding plane on the substrate.

36. A backplate for coupling a substrate to a computer chassis, the backplate comprising:
- an elongate body;
- a first tab extending from the elongate body;
- a second tab extending from the elongate body to form a longitudinal slot with the first tab for receiving the substrate; and
- a first tang that is extended from the first tab into the longitudinal slot, the tang being biased to retain the substrate when the substrate is received in the longitudinal slot.

37. The backplate of claim 36, wherein the first tab is positioned on the elongate body to make contact with a grounding plane when the substrate is received in the longitudinal slot.

38. The backplate of claim 36, wherein the second tab is positioned on the elongate body to make contact with a grounding plane when the substrate is received in the longitudinal slot.

* * * * *